(12) United States Patent
Fowler et al.

(10) Patent No.: US 9,203,200 B2
(45) Date of Patent: Dec. 1, 2015

(54) ROTATING VACUUM CHAMBER COUPLING ASSEMBLY

(71) Applicant: The Timken Company, North Carolina, OH (US)

(72) Inventors: Richard J. Fowler, North Canton, OH (US); Michael D. Drory, Dublin, NH (US)

(73) Assignee: The Timken Company, North Canton, OH (US)

( * ) Notice: Subject to any disclaimer, the term of this patent is extended or adjusted under 35 U.S.C. 154(b) by 0 days.

(21) Appl. No.: 14/403,289

(22) PCT Filed: Mar. 11, 2014

(86) PCT No.: PCT/US2014/023234
§ 371 (c)(1),
(2) Date: Nov. 24, 2014

(87) PCT Pub. No.: WO2014/159367
PCT Pub. Date: Oct. 2, 2014

(65) Prior Publication Data
US 2015/0104958 A1 Apr. 16, 2015

Related U.S. Application Data

(60) Provisional application No. 61/781,192, filed on Mar. 14, 2013.

(51) Int. Cl.
| | | |
|---|---|---|
| C23C 16/00 | (2006.01) | |
| C23F 1/00 | (2006.01) | |
| H01L 21/306 | (2006.01) | |
| H01R 39/64 | (2006.01) | |

(Continued)

(52) U.S. Cl.
CPC ............ *H01R 39/643* (2013.01); *C23C 14/505* (2013.01); *H01J 37/32* (2013.01);

(Continued)

(58) Field of Classification Search
CPC ............... H01J 37/32577; H01J 37/32706; H01J 37/32715; H01J 37/32; H01R 39/643; C23C 14/505; C23C 14/4584; C23C 14/4588; C23C 16/4586; C23C 16/50
USPC .......... 118/728–30, 725; 156/345.51–345.55; 361/234
See application file for complete search history.

(56) References Cited

U.S. PATENT DOCUMENTS

| | | | | |
|---|---|---|---|---|
| 4,580,522 A | * | 4/1986 | Fujioka et al. | ................ 118/500 |
| 4,945,774 A | * | 8/1990 | Beard et al. | ................ 73/863.11 |

(Continued)

FOREIGN PATENT DOCUMENTS

| | | |
|---|---|---|
| JP | 2001040484 | 2/2001 |
| JP | 2006037204 | 2/2006 |
| JP | 2010031363 | 2/2010 |

OTHER PUBLICATIONS

PCT/US2014/023234 International Search Report and Written Opinion, dated Aug. 13, 2014, 11 pages.

*Primary Examiner* — Rakesh Dhingra
(74) *Attorney, Agent, or Firm* — Michael Best & Friedrich LLP

(57) ABSTRACT

A coupling (30) for the introduction of a bias voltage into a vacuum chamber. The coupling consists of a metallic ball bearing assembly (36), a bearing sleeve or cup (34), and an EMI shielding gasket (42) seated within the bearing sleeve or cup. The ball bearing assembly is fitted within the EMI shielding gasket, about a metallic shaft (32) which, in turn, is coupled to a source of the bias voltage. The bearing sleeve or cup is, in turn, coupled to a rotating component such as a platen, for receiving the bias voltage within the vacuum chamber.

19 Claims, 5 Drawing Sheets

(51) Int. Cl.
*C23C 14/50* (2006.01)
*H01J 37/32* (2006.01)
*C23C 16/458* (2006.01)
*C23C 16/50* (2006.01)

(52) U.S. Cl.
CPC ..... *H01J 37/32577* (2013.01); *H01J 37/32706* (2013.01); *H01J 37/32715* (2013.01); *C23C 16/4584* (2013.01); *C23C 16/4586* (2013.01); *C23C 16/50* (2013.01)

(56) References Cited

U.S. PATENT DOCUMENTS

| | | | |
|---|---|---|---|
| 6,080,272 | A | 6/2000 | Langley et al. |
| 6,235,121 | B1 * | 5/2001 | Honma et al. ................. 118/730 |
| 2001/0029892 | A1 * | 10/2001 | Cook et al. ................. 118/723 E |
| 2007/0215047 | A1 | 9/2007 | Takimoto et al. |
| 2009/0181554 | A1 * | 7/2009 | Chin et al. ...................... 439/13 |

* cited by examiner

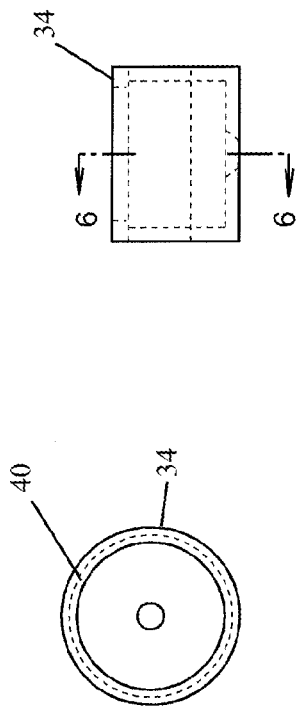
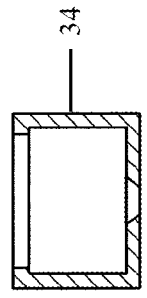
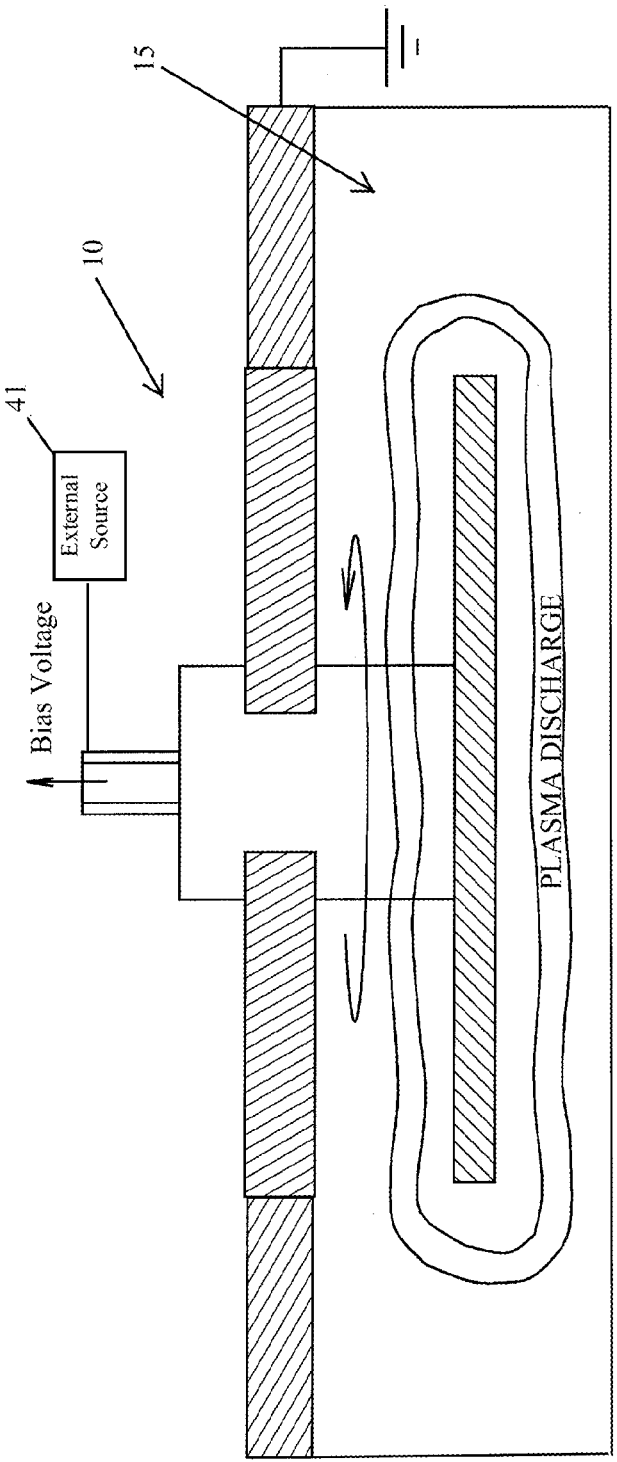

ROTATING VACUUM CHAMBER COUPLING ASSEMBLY

BACKGROUND

The present invention is related generally to vacuum chamber applications; and, in particular, to a coupling used to supply an electrical bias voltage to a platen rotating within the chamber to apply a coating to an object.

Vacuum coating chambers are used to apply certain types of coatings, usually thin film coatings, to various objects. The method employed utilizes an electrical bias voltage which is supplied to a plate rotating within the chamber, the voltage being used to generate or maintain a stable plasma. Conventional arrangements for doing this are generally both complex and expensive. Their operation is usually to introduce the voltage into the chamber through a stationary feed connected to a voltage source. The stationary feed is electrically coupled to the rotating plate through copper rings, carbon brushes, and wire mesh or gears, for the transmission of power. Other known arrangements utilize swash plates and flexible couplings. Again, while these other arrangements also succeed in conveying the required bias voltage from an external source to the rotating plate within the vacuum chamber, they are also costly, expensive, and create maintenance issues which limit the time available for use of the chamber.

Accordingly, it would be advantageous to provide a simple and cost effective coupling which provides greater higher reliability in introducing a bias voltage into a vacuum chamber having a rotating plate, but which does not require the complex arrangements currently in use and which require a high level of maintenance.

SUMMARY

Briefly stated, the present invention is directed to a coupling for introducing a bias voltage into a vacuum chamber in which a rotating plate is installed. The coupling comprises a metallic ball bearing, a bearing sleeve, and an EMI shielding gasket seated within the bearing sleeve. The ball bearing fits within the EMI shielding gasket, about a metallic shaft which in turn is coupled to a source of the bias voltage. The bearing sleeve is coupled to a rotating component, such as the platen mounted in the vacuum chamber and to which the bias voltage is directed.

The foregoing features, and advantages set forth in the present disclosure as well as presently preferred embodiments will become more apparent from the reading of the following description in connection with the accompanying drawings.

BRIEF DESCRIPTION OF THE DRAWINGS

FIG. 4 is a bottom plan view of a bearing cup for the coupling assembly;

FIG. 5 is a side view of the bearing cup of FIG. 4;

FIG. 6 is a sectional view of the bearing cup of FIG. 5 taken along line 6-6 in FIG. 5;

FIG. 7 is a simplified schematic illustrating a vacuum chamber partially illustrating its operation and delivery of a bias voltage to a rotating platen to generate or maintain a stable plasma within the chamber;

Corresponding reference numerals indicate corresponding parts throughout the several figures of the drawings. It is to be understood that the drawings are for illustrating the concepts set forth in the present disclosure and are not to scale.

Figure 10:
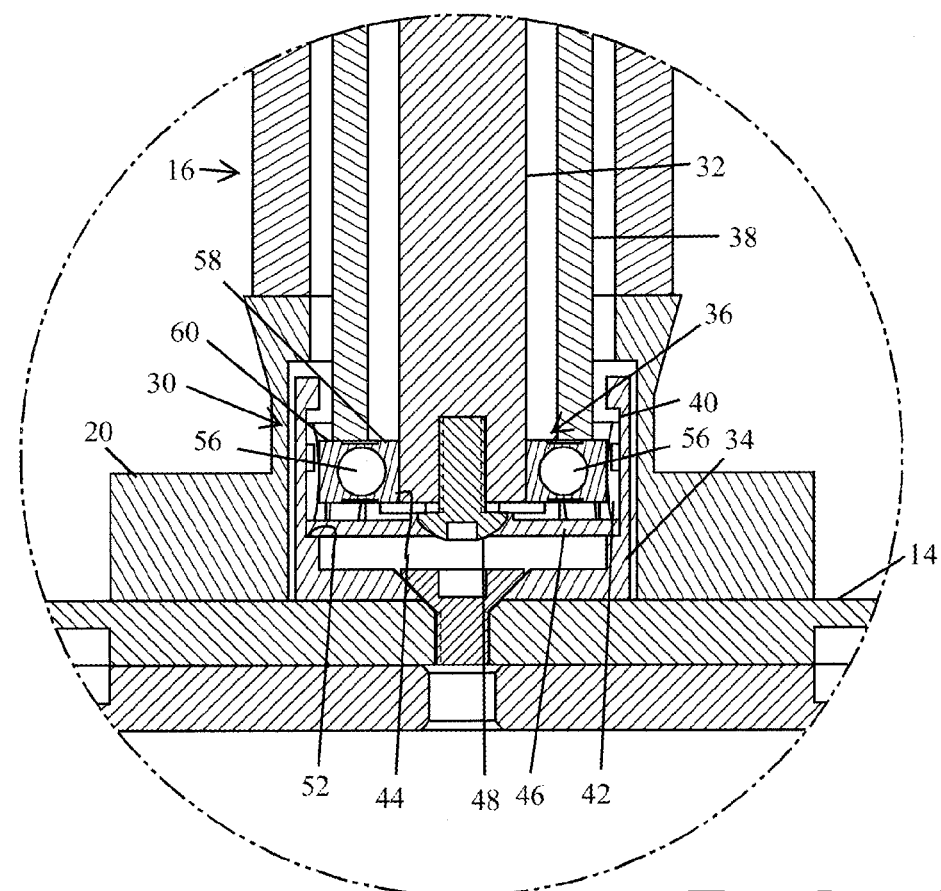

Before any embodiments of the invention are explained in detail, it is to be understood that the invention is not limited in its application to the details of construction and the arrangement of components set forth in the following description or illustrated in the drawings.

DETAILED DESCRIPTION

The following detailed description illustrates the invention by way of example and not by way of limitation. The description enables one skilled in the art to make and use the present disclosure, and describes several embodiments, adaptations, variations, alternatives, and uses of the present disclosure, including what is presently believed to be the best mode of carrying out the present disclosure.

Figure 1:
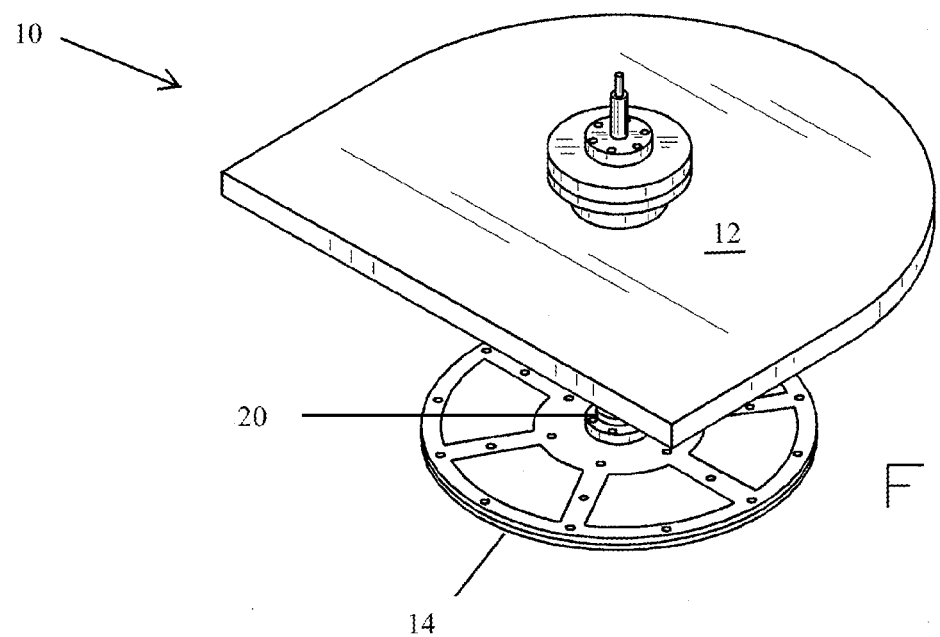
FIG. 1 is a perspective view of a rotating platen assembly for installation in a vacuum chamber.
Figure 2:
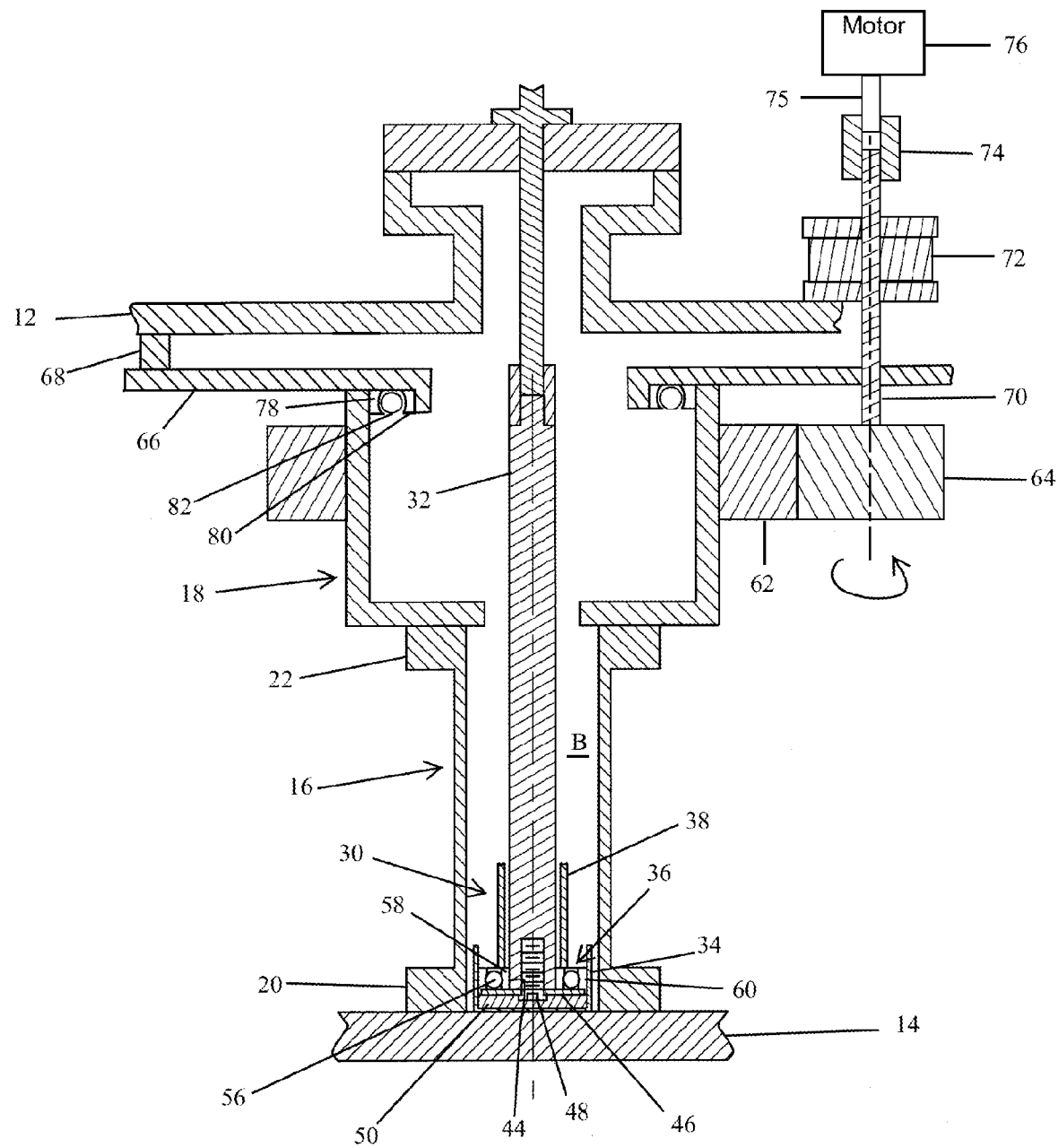
FIG. 2 is a partial sectional view of the rotating platen with a coupling assembly of the present invention.
Figure 3:
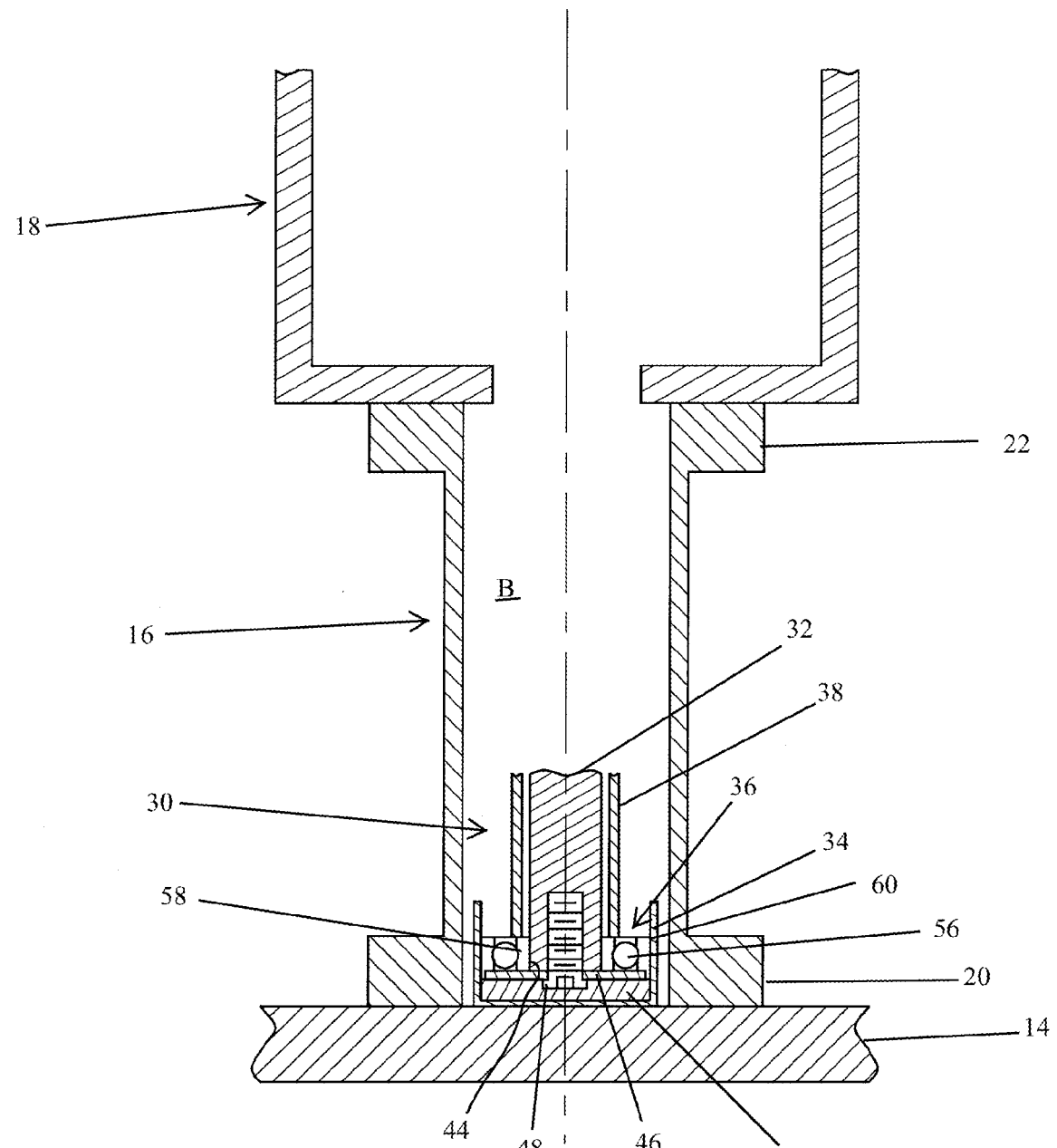
FIG. 3 is a sectional view similar to FIG. 2 and further illustrating the coupling assembly.
Figure 8:
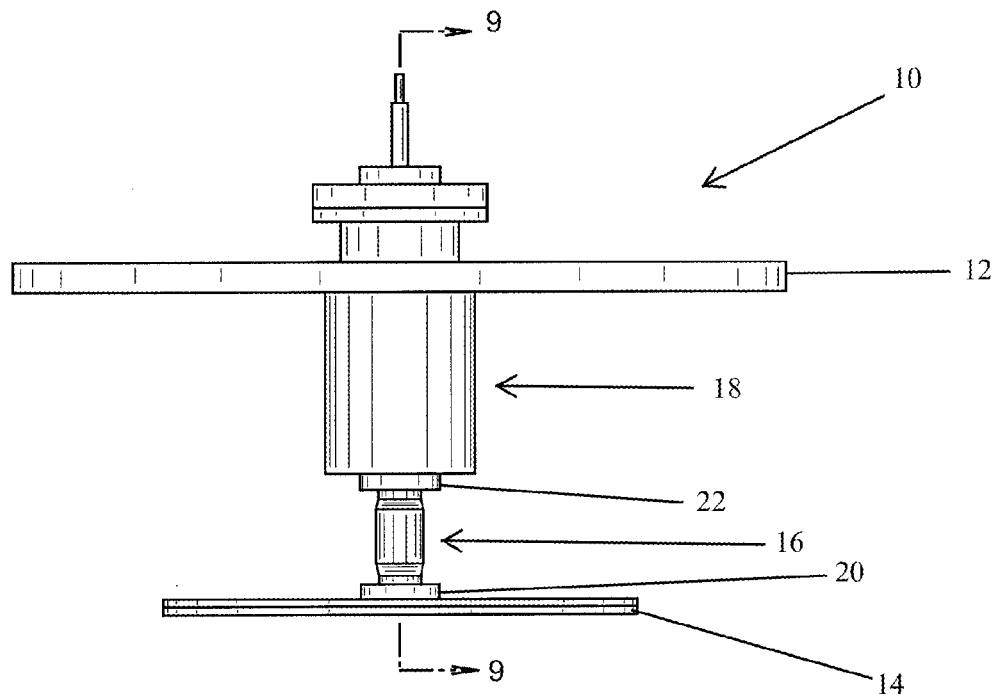
FIG. 8 is a side view of the platen assembly shown in FIG. 1.
Figure 9:
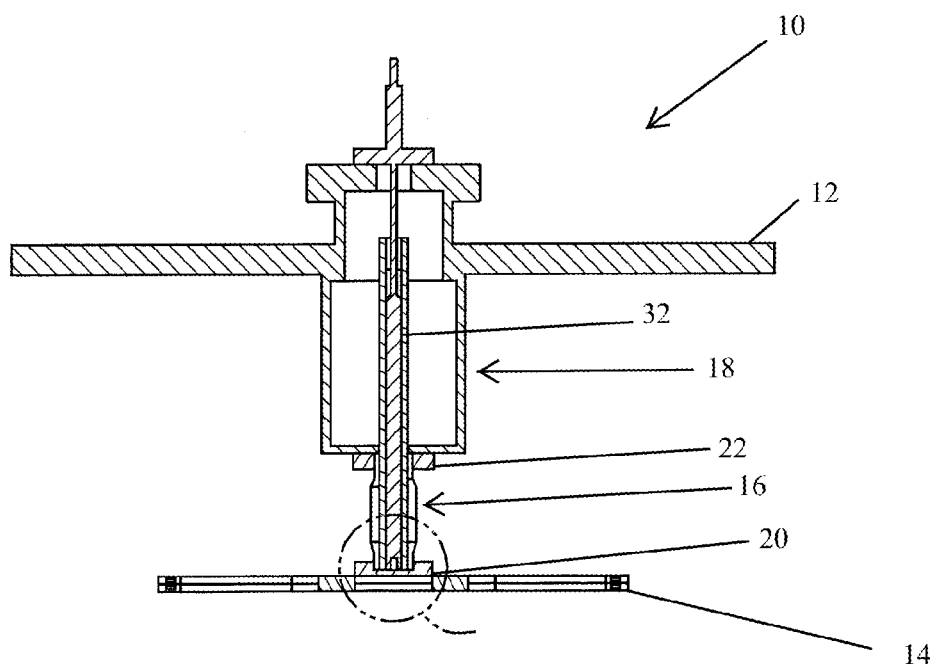
FIG. 9 is a sectional view of the coupling of FIG. 8, taken along line 9-9 in FIG. 8; and, FIG. 10 is an enlarged sectional view the bearing assembly shown in FIG. 9.

Referring to the drawings, a platen assembly 10 is shown in FIG. 1 including a rotatable base or platen 14 mounted to a plate 12. The assembly 10 is installed in a vacuum chamber 15 (FIG. 7), except for the plate 12 which may be a top, bottom, or side-wall of the vacuum chamber 15. Articles placed on the platen 14 are vacuum coated in a conventional manner, which is not described. As shown in FIGS. 2 and 3, a hollow cylindrical support 16 connects rotating platen 14 to a platen adapter 18 of which the support forms a part. The platen adaptor 18 is connected to a support bracket 66. The whole assembly 10 is then connected to the vacuum chamber 15 through a support block 68. A ball bearing assembly comprising races 78 and 80, and roller elements 82, which allow the platen adaptor 18 to rotate. Support 16 has a circular flange 20, 22 on each end to which the platen 14 and the adapter 18 are respectively connected in order to transmit the rotary motion of the platen 14 to the adapter 18. Seals (not shown) seal an axial bore B of support 16 and platen adapter 18 from exposure to the interior environment of the vacuum chamber 15. A driven gear 62 is attached to the platen adapter 18, the gear 62 being driven by a drive gear 64. The drive gear 64 is attached to a shaft 70 through a rotary feed through 72. The feed through 72 is sealed to plate 12 which allows vacuum to be achieved within the chamber 15. A coupler 74 is attached both to shaft 70 and to an output shaft 75 of an electric motor 76. The mechanical output of motor 76 is transmitted through coupled shafts 75 and 70 to drive gear 64. This, in turn, produces the rotary motion of driven gear 64 and platen adaptor 18.

As further shown in FIGS. 2 and 3, a coupling 30 of the present invention provides a pathway for introduction of a bias voltage into the vacuum chamber 15. Coupling 30 is disposed coaxially within an axial bore B of support 16. A copper rod or shaft 32 extends through support 16 into adapter 18, the shaft being concentrically installed within the support and adapter. The lower end of shaft 32 is mounted in coupling 30.

Coupling 30 includes a bearing sleeve or cup 34, a ball bearing assembly 36, and a cylindrical ceramic shield 38 which surrounds the lower end of shaft 32 and extends partially the length of the shaft. Bearing sleeve or cup 34 attaches directly to platen 14 (e.g., with a fastener as shown in FIG. 10 or without a fastener as shown in FIGS. 2 and 3), and is installed concentrically within bore B of support 16 at the base of the support. As shown in FIGS. 4 and 10, within the bearing sleeve or cup there can be an annular groove 40 formed for an EMI shielding gasket 42. EMI shielding gasket 42 is cut to length and inserted into the groove. Ball bearing assembly 36 is, in turn, mounted inside gasket 42 with the outer diameter of the assembly 36 contacting the inner diameter of the gasket 42. The base or lower end of shaft 32 is press fit on a central bore 44 of ball bearing assembly 36 and coupled to an external source 41 (FIG. 7) of bias voltage.

Ball bearing assembly 36 is secured to the lower, base end of shaft 32 using a large diameter retaining washer 46 through which a suitable fastener 48 (e.g., flat headed screw) is inserted into the shaft. The large diameter of washer 46 overlaps the outer diameter of shaft 32 and provides an annular surface to restrain the ball bearing assembly 36 against shield 38, and to prevent axial movement off the end of the copper shaft 32. As shown in FIGS. 2 and 3, a copper mesh 50 may be positioned between the underside of washer 46 and the base of bearing cup 34. As shown in FIG. 10, the outer margin of washer 46 may be seated upon a shoulder 52 formed at the lower end of groove 40.

Preferably, the ball bearing assembly 36 is constructed of electrically conductive materials capable of conveying a bias voltage from the external source 41 through the copper shaft 32 to the bearing cup 34 and then to the rotating platen 14. A suitable material for this construction is a stainless steel which allows the bias voltage to be conveyed from the copper shaft to EMI gasket 42. It will further be recognized that while the bearing assembly shown in the drawings has a plurality of balls as rolling elements 56 disposed between an inner race 58 and an outer race 60, the coupling of the present disclosure may incorporate a variety of different bearing configurations, such as, but not limited to, cylindrical bearings, tapered bearings, or needle bearings.

In some embodiments, a flexible and compliant conductive material, such as the copper mesh 50 shown in FIGS. 2 and 3, may be used in place of the EMI gasket 42, this mesh material filling any voids between an axial end of ball bearing assembly 36 and bearing sleeve or cup 34.

During operation, the bias voltage is delivered to the rotating platen 14 through shaft 32, this voltage passing coaxially through the rotating platen adapter 18. The bias voltage then passes through the ball bearing assembly 36 and into the rotating platen 14 via the electrical contact between the ball bearing assembly 36, the EMI gasket 42 (or the copper mesh 50), and the bearing sleeve or cup 34. Those of ordinary skill in the art will recognize that the copper shaft and stainless steel ball bearing assembly may optionally be formed from any of a variety of other electrically conductive materials capable of conveying the bias voltage from the external source to the rotating platen within the vacuum chamber 15.

As various changes could be made in the above constructions without departing from the scope of the disclosure, it is intended that all matter contained in the above description or shown in the accompanying drawings shall be interpreted as illustrative and not in a limiting sense.

Various features and advantages of the invention are set forth in the following claims.

What is claimed is:

1. A coupling for conveying a bias voltage to a rotating platen supported within an enclosed vacuum chamber, the coupling comprising:

an electrically conductive bearing cup, said bearing cup axially secured at a base to said rotating platen for rotation therewith, the rotating platen being supported within the enclosed vacuum chamber, and the bearing cup having an annular sidewall extending axially from said base into an axial bore of a rotating platen adapter;

a stationary electrically conductive rod coaxially disposed within the axial bore of the rotating platen adapter, said electrically conductive rod coupled to an external source of bias voltage and extending coaxially within said bearing cup annular sidewall;

an electrically conductive bearing fitted within said bearing cup, said bearing having an outer race with an outer diameter electrically coupled to said bearing cup, an inner race with an inner diameter fitted to said electrically conductive rod, and a plurality of electrically conductive rolling elements disposed between said inner race and said outer race; and wherein said rod, said bearing, and said bearing cup define a pathway for the delivery of the bias voltage from said external source to said rotating platen.

2. The coupling of claim 1, further including an EMI shield seated within an inner diameter of said bearing cup;

wherein said outer diameter of said outer race of the bearing is seated within an inner diameter of said EMI shield; and wherein said EMI shield is included within said defined pathway for the delivery of the bias voltage.

3. The coupling of claim 2, wherein said inner diameter of said bearing cup includes an annular recessed region, said recessed region configured to receive and retain said EMI shield.

4. The coupling of claim 1, further including a metallic mesh disposed between said bearing cup and at least a portion of said bearing, said metallic mesh included within said defined pathway for the conveyance of said bias voltage.

5. The coupling of claim 1, wherein said electrically conductive rod includes copper.

6. The coupling of claim 1, wherein said bearing is a ball bearing, and wherein said plurality of rolling elements are balls.

7. The coupling of claim 1, wherein said outer race, said inner race, and said plurality of rolling elements include stainless steel.

8. The coupling of claim 1, further including a retaining washer secured to an axial end of said electrically conductive rod, said retaining washer abutting at least a portion of an axial end of said bearing inner race to retain said bearing on said electrically conductive rod.

9. A coupling for conveying a bias voltage to a rotating component supported within an enclosed vacuum chamber, the coupling comprising:

a rotating mount for supporting the rotating component within the enclosed vacuum chamber, said rotating mount having an axial bore at an axial end adjacent said rotating component;

a stationary electrically conductive rod disposed within said axial bore of said rotating mount, said rod electrically coupled to an external source of bias voltage;

a bearing cup axially secured to said rotating component for rotation therewith, said bearing cup having an annular sidewall extending into said axial bore of said rotating mount and which is coaxially disposed about said electrically conductive rod;

an electrically conductive bearing having an inner race coupled to said stationary rod, an outer race coupled to, and rotating with, said bearing cup annular sidewall, and a plurality of rolling elements disposed between said inner race and said outer race; and wherein said rod, said bearing, and said bearing cup define a pathway for the delivery of the bias voltage to the rotating component.

10. The coupling of claim 9, further including an EMI shield disposed within said bearing cup, said EMI shield supporting said outer race of said bearing within said bearing cup.

11. The coupling of claim 9, wherein said bearing cup is electrically conductive.

12. The coupling of claim 9, wherein said rotating component is supported in a vacuum chamber.

13. A coupling for conveying a bias voltage to a rotating platen supported within an enclosed vacuum chamber, the coupling comprising:

an electrically conductive bearing cup axially secured at a base to said rotating platen for rotation therewith and having an annular sidewall extending axially from said base into an axial bore of a rotating platen adapter;

a stationary electrically conductive rod, said electrically conductive rod coupled to an external source of bias voltage;

an electrically conductive bearing fitted within said bearing cup; and wherein said rod, said bearing, and said bearing cup define a pathway for the delivery of the bias voltage from said external source to said rotating platen supported within the enclosed vacuum chamber.

14. The coupling of claim 13, wherein the electrically conductive rod is coaxially disposed within the axial bore of the rotating platen adapter and extending coaxially within said bearing cup annular sidewall.

15. The coupling of claim 13, wherein said bearing has an outer race with an outer diameter electrically coupled to said bearing cup, an inner race with an inner diameter fitted to said electrically conductive rod, and a plurality of electrically conductive rolling elements disposed between said inner race and said outer race.

16. The coupling of claim 15, further including an EMI shield disposed within said bearing cup, said EMI shield supporting said outer race of said bearing within said bearing cup.

17. The coupling of claim 16, wherein said inner diameter of said bearing cup includes an annular recessed region, said recessed region configured to receive and retain said EMI shield.

18. The coupling of claim 13, further including a retaining washer secured to an axial end of said electrically conductive rod, said retaining washer abutting at least a portion of an axial end of said bearing inner race to retain said bearing on said electrically conductive rod.

19. The coupling of claim 13, further including a metallic mesh disposed between said bearing cup and at least a portion of said bearing, said metallic mesh included within said defined pathway for the conveyance of said bias voltage.

* * * * *